United States Patent
Deng et al.

(10) Patent No.: US 7,039,818 B2
(45) Date of Patent: May 2, 2006

(54) LOW LEAKAGE SRAM SCHEME

(75) Inventors: Xiaowei Deng, Plano, TX (US); Theodore W. Houston, Richardson, TX (US)

(73) Assignee: Texas Instruments Incorporated, Dallas, TX (US)

( * ) Notice: Subject to any disclaimer, the term of this patent is extended or adjusted under 35 U.S.C. 154(b) by 501 days.

(21) Appl. No.: 10/349,277

(22) Filed: Jan. 22, 2003

(65) Prior Publication Data

US 2004/0143769 A1    Jul. 22, 2004

(51) Int. Cl.
    G06F 1/32      (2006.01)
(52) U.S. Cl. ............... 713/320; 713/300; 713/323; 713/324
(58) Field of Classification Search ............ 713/300, 713/320, 323, 324
    See application file for complete search history.

(56) References Cited

U.S. PATENT DOCUMENTS

| | | | |
|---|---|---|---|
| 5,590,082 A * | 12/1996 | Abe | 365/222 |
| 5,740,118 A * | 4/1998 | Sato et al. | 365/222 |
| 6,256,252 B1 * | 7/2001 | Arimoto | 365/227 |
| 6,414,894 B1 * | 7/2002 | Ooishi et al. | 365/222 |
| 6,657,911 B1 * | 12/2003 | Yamaoka et al. | 365/226 |
| 6,678,202 B1 * | 1/2004 | Scott | 365/229 |
| 6,768,144 B1 * | 7/2004 | Houston et al. | 257/207 |

* cited by examiner

*Primary Examiner*—Thomas C. Lee
*Assistant Examiner*—Vincent Tran
(74) *Attorney, Agent, or Firm*—Rose Alyssa Keagy; W. James Brady, III; Frederick J. Telecky, Jr.

(57) ABSTRACT

A memory device (20) having substantially reduced leakage current in a sleep/data retention mode whereby at least a portion (25, 28) of the periphery circuitry (24) shares the same power supplies VDDA and/or VSSA of the memory array (22) such that during sleep/data retention mode the voltage across both the portion (25, 28) of the periphery circuitry (24) and the memory array (22) of the selected SRAM block is reduced, while all other circuits can be shut down except the sleep control circuits as well as selected latches, flip-flops, etc. whose contents need to be retained. A sequence for powering up and shutting down portions of the periphery circuitry (24) and the external circuitry (26) is also provided.

17 Claims, 2 Drawing Sheets

LOW LEAKAGE SRAM SCHEME

CROSS REFERENCE TO RELATED APPLICATIONS

Cross reference is made to commonly assigned patent application Ser. No. 10/337,069 entitled "BIT-LINE CONTROL FOR LOW POWER IN STANDBY" filed Jan. 6, 2003, the teachings of which are incorporated herein by reference.

FIELD OF THE INVENTION

The present invention is generally related to memory devices, and more particularly to memory cells and leakage current thereof in a sleep/data retention mode.

BACKGROUND OF THE INVENTION

Circuits comprising or associated with a memory include the memory cell array that stores the data, memory periphery circuits that enable access to the memory cell array for READ and for WRITE, and external circuits. The memory cell array is generally arranged in rows and columns. Word lines that control access to the cells run in the row direction. Bit lines that carry data to and from the cell run in the column direction. The memory periphery circuits comprise row periphery that drives the word lines, column periphery that drives or senses the bit lines; address decode circuitry, and control circuitry. Generally, the row periphery includes means for disabling the word lines to avoid the possibility of data corruption during address transitions. The external circuits may interface with the memory but are not a direct part of the memory function and may comprise general logic and I/O buffers.

Power is supplied to a chip by a high voltage supply generally designated as Vdd, and a low voltage or reference supply generally designated as Vss. Chip power can be reduced by lowering or disconnecting from Vdd or raising or disconnecting from Vss. Some minimum voltage must be maintained for retention of volatile memory such as SRAM, and some minimum voltage must be maintained for logic operation.

Minimizing SRAM standby power during sleep/data retention mode is critical to many applications, especially in wireless devices and other portable devices. One prior art approach is to reduce the power supply voltage across the whole chip during sleep/data retention mode, such that the leakage current of the whole chip is reduced while the contents of the SRAM(s) on the chip are still retained. With the continued increment in the transistor leakage and the number of transistors on a chip, however, the total chip current leakage using this approach has become completely unacceptable for wireless applications based on state of art semiconductor technologies.

Another prior art approach that is being used for on-chip power management during sleep/data retention mode is to segment the voltage supply to allow different voltages to be supplied to a memory array versus to the memory periphery circuitry and other circuitry external to the memory. This is illustrated at 10 in FIG. 1. In the reduced power mode, the power supply voltage is reduced across selected SRAM array(s) whose contents need to be retained. Power is shut down to all other circuits (for example, by switches separating the circuitry from VDD and/or from VSS) except (a) the periphery circuitry associated with the selected SRAM array as required for integrity of the retained memory, (b) selected latches, flip-flops, etc. whose contents also need to be retained, and (c) sleep control circuits. Interface circuits are used when necessary along the boundary between different power domains to ensure that the selected SRAM array(s) and/or latches/flip-flops etc. maintain the data during the sleep/data retention mode and that no excessive through currents exist during the slow power down and up transitions. The periphery circuitry associated with the selected SRAM array(s) is powered to ensure that the word lines and bit lines of the selected SRAM array(s) are at determined voltage levels to prevent the contents of the SRAM cells from being corrupted. This is illustrated at 10 in FIG. 1, where the periphery power supplies are kept at the chip VDD/VSS levels, while either the array VDDA is lowered or the array VSSA is raised, or both methods are used to reduce the voltage across the array. In the power-down mode, the interface between the powered periphery circuitry and the external circuitry must be controlled such that the periphery is in a state that maintains the stored data.

The problem with the above approach is that the periphery leakage becomes significant as compared with the array leakage that is aggressively reduced by using much reduced voltages across the array and other advanced techniques, such as disclosed in the commonly assigned cross referenced patent application, the teaching of which is incorporated herein by reference. Even with the use of longer gate length or higher nwell bias, etc., the periphery current leakage cannot be reduced to significantly below the level of the array leakage in advanced CMOS technologies, since the direct gate tunneling leakage cannot be reduced.

Another prior art approach that is being used for on-chip power management during sleep/data retention mode is to shut down power to the memory periphery circuits. This approach requires the addition of circuitry to hold the memory in an unaccessed state while the periphery circuits are not powered. The problem with this approach is that the transition of control of the word lines between the periphery circuit word line drivers to the low power mode circuits is critical, and particularly difficult because of the relatively large word line drivers. Further, the circuitry required to hold each word line off may incur significant leakage.

Thus, there is a need for a low power mode with retained memory that has reduced power for the array and associated periphery and allows full removal of power to selected circuits, with low risk of corrupting the stored data and with low overhead.

SUMMARY OF THE INVENTION

The present invention achieves technical advantage as a memory device whereby at least a portion of the memory periphery circuitry shares the same power supplies VDDA and/or VSSA of the memory array such that during sleep/data retention mode the voltage across both the portion of the periphery circuitry and the memory array of the selected SRAM block is reduced, while all other circuits can be shut down except the sleep control circuits as well as selected latches, flip-flops, etc. whose contents need to be retained.

BRIEF DESCRIPTION OF THE DRAWINGS

FIG. 2a shows the memory array and the periphery circuitry all at VDDA/VSSA, and external circuitry at VDD/VSS; FIG. 2b shows a portion of the periphery circuitry supplied by VDD/VSS; FIG. 2c shows a portion of the external circuitry supplied by VDDA/VSSA; and FIG. 2d shows that portion of the periphery circuitry from word line enable through word line drivers supplied by VDDA and VSSA;

DETAILED DESCRIPTION OF THE PREFERRED EMBODIMENT

Figure 1:
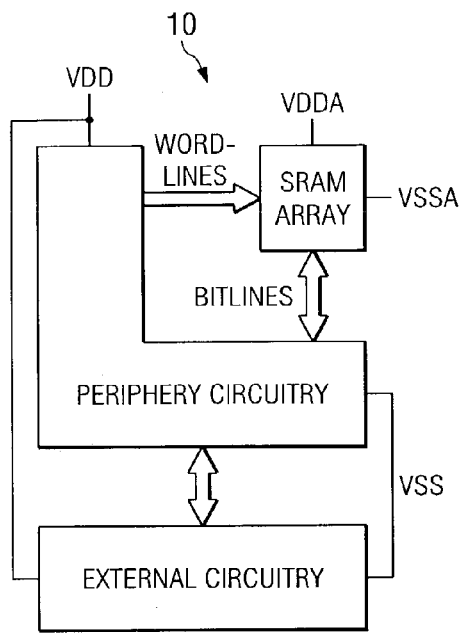
FIG. 1 is a block diagram of a conventional approach where the periphery power supplies are kept at the chip VDD/VSS levels, while either the memory array VDDA is lowered or the memory array VSSA is raised, or both methods are used to reduce the voltage across the memory array.

According to embodiments of the present invention, as shown at 20, 30, 40 and 50 in FIGS. 2a–FIG. 2d, respectively, the present invention achieves technical advantages whereby at least a portion of the periphery circuitry 24 shares the same power supplies VDDA and/or VSSA of the memory array 22 such that during sleep/data retention mode the voltage across both the commonly powered portion of the periphery circuitry 24 and array of the selected SRAM block 22 is reduced. Advantageously, all other circuits, including other non-commonly powered portions of the periphery circuitry 24 and external circuitry 26 interfacing with the periphery circuitry, can be shut down (for example, by switches separating the periphery circuitry 24 from VDD and/or from Vss) except the sleep control circuits therein as well as selected latches, flip-flops, etc. whose contents need to be retained. Optionally, the supplies VDD and VSS can be set to zero in standby, and additional supplies can be provided for the external circuitry that must be maintained in standby. Optionally, at least a portion of the other circuits not shut down in standby can be powered by VDDA and/or VSSA. The portion of the periphery circuitry powered by VDDA and/or VSSA remains functional, and the associated standby power is significantly reduced due to the exponential voltage dependence of leakage.

The voltage dependence of the memory array 22 and periphery circuitry 24 on supply voltage is shown the various embodiments in Table 1.

TABLE 1

Leakage in standby with 1 Meg retained memory

| Array Voltage (V) | Periphery Voltage (V) | Array Leakage (uA/Mb) | Periphery Leakage (uA/Mb) | Total Leakage (uA/Mb) |
| --- | --- | --- | --- | --- |
| 1.2 | 1.2 | 3285 | 150 | 3435 |
| 0.4 | 1.2 | 419 | 150 | 569 |
| 0.4 | 0.4 | 108 | 8 | 116 |

The memory array 22 and periphery circuitry 24 leakage current numbers in Table 1 show that in the active mode, the periphery circuitry 24 leakage current is small compared to the memory array 24 leakage current. However, if the memory array 22 voltage is reduced and the periphery circuitry 24 voltage is not reduced, the periphery circuitry 24 leakage is significant relative to the reduced memory array 24 leakage. If the periphery circuitry 24 voltage is also reduced in standby the same as the memory array 24 voltage, the periphery circuitry 24 leakage is reduced significantly. Moreover, matching the periphery circuitry 24 voltage to the memory array 22 voltage in standby significantly reduces the memory array 22 voltage. This is a result of the impact on memory array 22 leakage by the word line voltage and bit line voltages that are set by the periphery circuitry 24 voltage. With the periphery circuitry 24 powered, albeit at a reduced voltage, proper control of WL and BL voltages is maintained and achieves substantially lower leakage current.

Memory array 22 leakage current in standby can be further reduced by application of back gate bias to raise the transistor threshold voltages. For example, the bias of the n-well in the memory array 22 can be raised to lower the p-channel transistor leakage. If back gate bias is used to lower the memory array 22 leakage, periphery circuitry 24 leakage can also be further reduced by applying the same back gate bias in the periphery circuitry as applied in the memory array.

Optionally, the row/column repair information is also retained in the redundancy latches in the periphery circuitry 24 powered by VDDA and/or VSSA, thus reducing standby power while avoiding excess time delay and power needed to rescan the repair information from the fuse bank every time the SRAM 22 is returned to active mode. Area overhead and design overhead are very small.

Figure 2A:
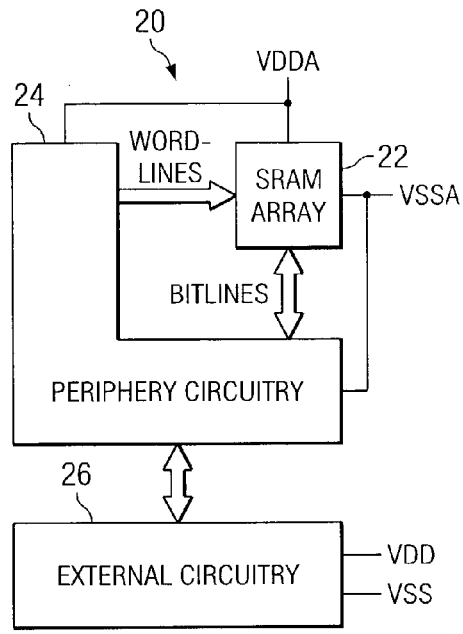
FIGS. 2a 2b, 2c and 2d are block diagrams of various embodiments of the present invention whereby at least portions of the periphey circuitry share the same power supplies VDDA and/or VSSA of the array such that during sleep/data retention mode the voltage across both the periphery circuitry portion and the memory array of the selected SRAM block is reduced.

In the first embodiment shown at 20 in FIG. 2a the full memory periphery circuitry 24 is powered with the memory array 22 supplies, VDDA and/or VSSA. Memory control signals in the periphery circuitry 24 are set to have the memory array 22 unaccessed, such that the powered row periphery circuitry maintains all word lines off. Further, the memory control signals are set to have the column periphery circuitry output drivers in tri-state, so that the powered column periphery circuitry does not drive the external circuitry 26 data lines. For transition into the power down mode, the preferred sequence is to first set the control signals in the periphery circuitry 24, followed by transitioning VDDA and/or VSSA to the power down levels and reducing and/or removing power to selected external circuitry 26. For transition from the power down mode to the active mode, the preferred sequence is to restore VDDA and/or VSSA to the active levels and to restore active power to the selected external circuitry 26, followed by enabling access of the periphery circuitry 24 to the memory array 22. In the power down mode, the bit lines may be held by the periphery circuitry 24 at the standard precharge voltage, generally VDDA. Optionally, in the power down mode, the bit lines may be allowed by the periphery circuitry 24 to float or be held at VSSA.

Figure 2B:
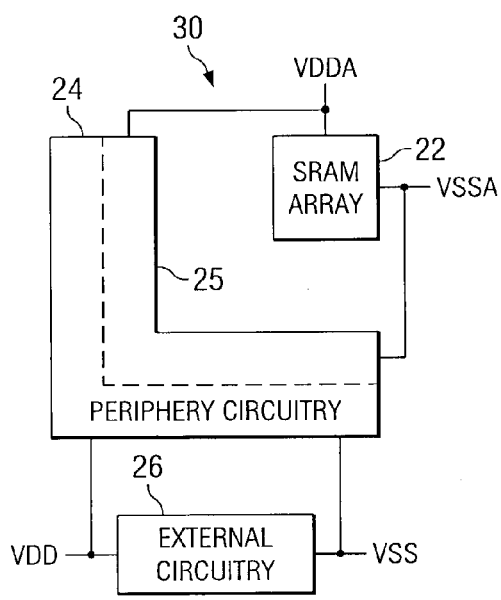
Figure 3:
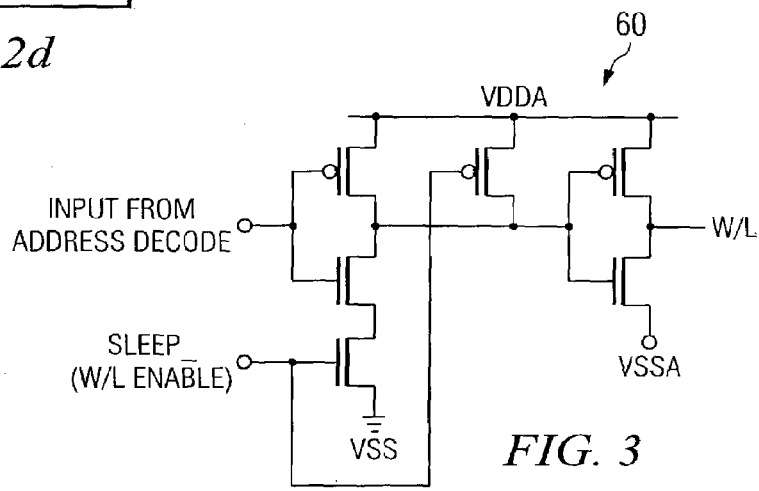
FIG. 3 is a schematic of a circuit ensuring word lines are held off in standby.

In the second embodiment shown at 30 in FIG. 2b, the word line drivers in the portion 25 of periphery circuitry 24 are powered with the array supplies VDDA and/or VSSA, and other periphery circuits outside of portion 25 are powered similar to external circuitry 26. Circuits are provided, such as illustrated at 60 in FIG. 3, to ensure that the input to the word line drivers during the power down mode is such to keep the word lines off. It is efficient to have circuitry with the dual function of selectively enabling word lines in the active mode and ensuring the word lines are off in the power down mode. The word line enable circuitry may be immediately before the word line drivers, as in FIG. 3, or there may be additional circuits, such as a buffering inverters, between the word line enable circuits and the word line drivers. The portion 25 of periphery circuitry 24 may include all circuits from the word line enable circuits to and including the word line drivers. For transition into the reduced power mode, a preferred sequence is first to disable access of the periphery circuitry 24 to the memory array 22, then to set control of the input to the word line drivers for the reduced power mode, and then to transition the voltages of VDDA and/or VSSA to the reduced power values and to reduce or remove power to selected external circuits 26 and to portions other than portion 25 of the periphery circuitry 24. For transition out of the reduced power mode, a preferred sequence is first to restore voltages VDDA and/or VSSA to active mode values and restore power to selected external circuits 26 and to portions other than portions 25 of the periphery circuitry 24, then to remove the reduced power mode control of the input to the word line drivers, and then to enable access to the memory array 22.

Figure 2C:
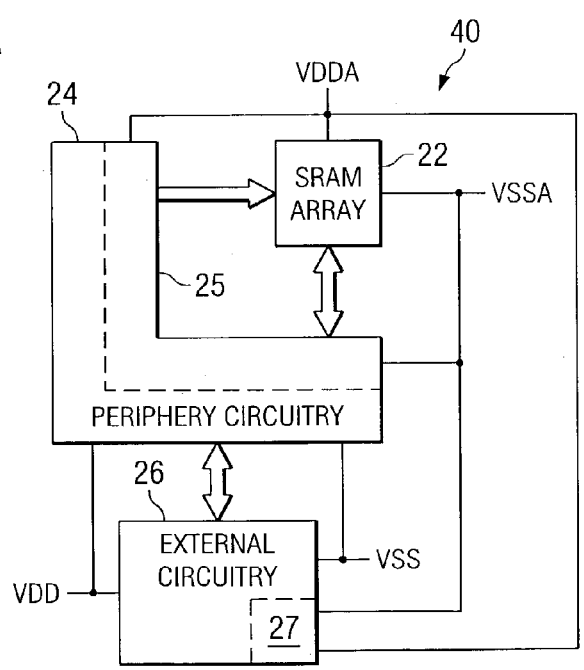

In the third embodiment shown at 40 in FIG. 2c a portion 27 of the external circuitry is supplied with VDDA and/or VSSA.

Figure 2D:
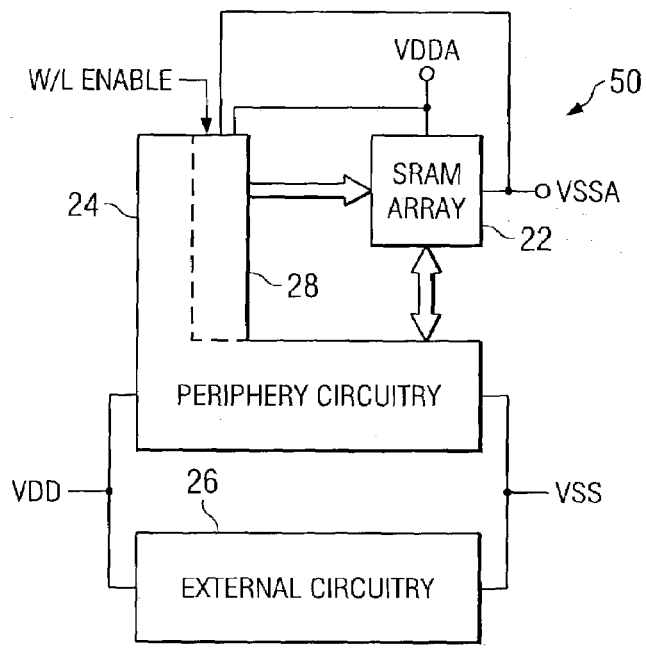

In the fourth embodiment shown at 50 in FIG. 2d, the portion 28 of the periphery circuitry from that controlled by the word line enable forward to and including the word line drivers is powered with the array supplies VDDA and/or VSSA. Other periphery circuitry is optionally connected to VDD and VSS or to VDDA and/or VSSA or powered otherwise. For transition into the reduced power mode, the preferred sequence is to disable word line, and then transition VDDA and/or VSSA to the power down levels and selectively reduce or remove power to other circuits, optionally including portions of the periphery circuits. For transition out of the reduced power mode, the preferred sequence is to restore VDDA and/or VSSA to active mode values and restore power to selected external circuits and to portions of the periphery circuitry, then to enable word line.

In order to ensure the proper operation of the SRAM 22, input/output circuitry 26 is advantageously disposed between the SRAM 22 and the external logic 24 and provides proper power-down/wake-up sequence among the SRAM 22 and external logic 24. The SRAM circuitry 26 enables input, clock input, and/or other control inputs to be disabled/frozen before powering down the SRAM 22 and external logic 24, in order to avoid the loss of data due to a logic glitch. Also, the input/output circuitry 26 between the SRAM 22 and the external logic 24 is gated by the sleep control signal to avoid excess through current during the slow power-down/wake-up transitions.

Figure 4:
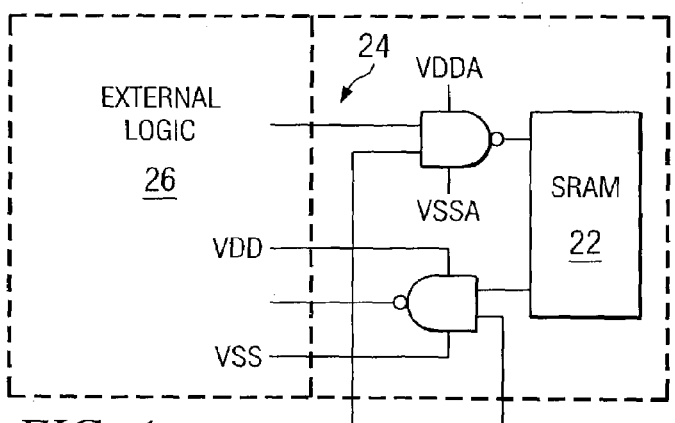
FIG. 4 is a schematic of the input/output circuitry between the SRAM and the external logic for avoiding excess current leakage.

As shown in FIG. 4, the control signal SLZ is enabled (=VSS) before powering down the SRAM 22 and the external logic 24, assuming the VDD>=VDDA>VSSA>=VSS and that the external logic 24 is shut down from VSS (float up to VDD).

Advantageously, there is no danger of data loss due to WL going above array Vss or BL going below WL voltage, since WL is solidly held at row periphery Vss (=array Vss) and BL cannot be lower than column periphery Vss (=array Vss). Further, there is no area overhead and no additional complicated timing control, yet the present invention achieves periphery leakage well below the array leakage level (for relatively large array configuration).

Though the invention has been described with respect to a specific preferred embodiment, many variations and modifications will become apparent to those skilled in the art upon reading the present application. For example, the array voltages VDDA and/or VSSA may be extended to the periphery circuitry through switches rather than by direct connection. Also, the periphery voltages and array voltages may be from separate supplies but controlled to be substantially equal to each other, different from other on-chip voltages in standby. It should also be recognized that because of voltage drops, there may be some variation among nominally equal voltages. It is therefore the intention that the appended claims be interpreted as broadly as possible in view of the prior art to include all such variations and modifications.

We claim:
1. A memory device, comprising;
a plurality of memory cells arranged in columns and rows forming a memory cell array and having array voltages VDDA and VSSA;
periphery circuitry for at least one of controlling access to the memory cell array, writing data to the memory cell array, and reading data from the memory cell array, wherein at least a portion of said periphery circuitry also having substantially at least one of voltages VDDA and VSSA;
external circuitry interfaced to said periphery circuitry, said external circuitry having supply voltages VDD and VSS; and
sleep control circuitry coupled to and controlling the memory cell array, such that said at least one of VDDA and VSSA is different from VDD and VSS in a low power mode with retained memory.
2. The memory device as specified in claim 1 wherein the control circuitry provides proper power-down/wake-up sequence among the memory cell array and the external circuitry.
3. The memory device as specified in claim 2 wherein the memory device further comprises additional circuitry being shut down in a sleep/data retention mode by the control circuitry.
4. The memory device as specified in claim 3 wherein the memory cell array has at least one of an enable input, clock input, and control inputs, whereby the at least one of enable input, clock input and control input is disabled before powering down the memory cell array in the sleep/data retention mode.
5. The memory device as specified in claim 1 wherein the sleep control circuitry normally operates from control circuitry voltages VDDA and VSSA, whereby: VDD>=VDDA>VSSA>=VSS.
6. The memory device as specified in claim 5 wherein the control circuitry is shut down from VSS.
7. The memory device as specified in claim 1 wherein the memory cell array and the at least a portion of the periphery circuitry operate from reduced voltages in the sleep/data retention mode.
8. The memory device of claim 1 wherein at least one of at least a portion of the external circuitry and at least a portion of the sleep control circuitry has supply voltages VDDA and VSSA.
9. The memory device of claim 1 wherein a common back gate bias is applied the memory array and to the periphery circuitry in standby.
10. An integrated circuit comprising;
a memory array, periphery circuitry associated with the memory array, external circuitry, voltage supplies VDDA and VSSA connected to the memory array and to at least a portion of the associated periphery circuitry, and voltage supplies Vdd and Vss connected to the external circuitry;
wherein the memory array and the associated periphery circuitry are adapted to maintain a low power state with retention of memory with a reduced difference between

VDDA and VSSA relative to the voltage difference between VDDA and VSSA in an active state, where at least one of VDDA may be different from Vdd in standby or VSSA may be different from Vss in standby.

11. The integrated circuit of claim 10 wherein power is selectively disconnected to at least a portion of the external circuitry during standby.

12. The integrated circuit of claim 10 wherein the portion of the periphery circuitry connected to VDDA and VSSA comprises word line drivers.

13. The integrated circuit of claim 12 wherein the portion of the periphery circuitry connected to VDDA and VSSA further comprises that portion of the row periphery circuitry from the word line enable circuits to the word line drivers.

14. The integrated circuit of claim 10 wherein at least one of VDDA and VSSA is connected to at least a portion of the external circuitry.

15. The integrated circuit of claim 14 wherein the at least a portion of the external circuitry comprises latches for storage of redundancy information.

16. An integrated circuit, comprising;
an array of memory cells arranged in columns and rows having array voltages VDDA and VSSA;
periphery circuitry for at least one of controlling access to the array of memory cells, writing data to the array of memory cells, and reading data from the array of memory cells;
external circuitry interfaced to said periphery circuitry, said external circuitry having supply voltages VDD and VSS;
additional external circuitry, said additional external circuitry also having at least one of voltages VDDA and VSSA; and
sleep control circuitry coupled to and controlling the memory cell array, such that said at least one of VDDA and VSSA is different from VDD and VSS in a low power mode with retained memory.

17. The integrated circuit of claim 16 wherein said additional external circuitry comprises latches for storage of redundancy information.

* * * * *